United States Patent [19]

Schwalke et al.

[11] Patent Number: 5,190,888
[45] Date of Patent: Mar. 2, 1993

[54] METHOD FOR PRODUCING A DOPED POLYCIDE LAYER ON A SEMICONDUCTOR SUBSTRATE

[75] Inventors: Udo Schwalke, Williston, Vt.; Ralf Burmester, Ratingen, Fed. Rep. of Germany

[73] Assignee: Siemens Aktiengesellschaft, Munich, Fed. Rep. of Germany

[21] Appl. No.: 779,408

[22] Filed: Oct. 17, 1991

[30] Foreign Application Priority Data

Oct. 23, 1990 [XH] Hague .............. 90120324.0

[51] Int. Cl.⁵ .............................. H01L 21/335
[52] U.S. Cl. ................................ 437/57; 437/193; 437/200; 437/44
[58] Field of Search ............. 437/200, 57, 44, 58, 437/193

[56] References Cited

U.S. PATENT DOCUMENTS

| | | | |
|---|---|---|---|
| 4,555,842 | 12/1985 | Levinstein et al. | 437/56 |
| 4,740,479 | 4/1988 | Neppl et al. | 437/34 |
| 4,782,033 | 11/1988 | Gierisch et al. | 437/56 |
| 4,808,548 | 2/1989 | Thomas et al. | 437/57 |
| 4,816,423 | 3/1989 | Havemann | 437/31 |
| 4,912,061 | 3/1990 | Nasr | 437/44 |
| 4,933,994 | 6/1990 | Orban | 437/44 |
| 5,059,546 | 10/1991 | Havemann | 437/34 |

OTHER PUBLICATIONS

"Development of the Self-Aligned Titanium Silicide Process for VLSI Applications", by M. E. Alaperin et al., IEEE Transactions of Electron Devices, vol. ED-32, No. 2, Feb. 1985, pp. 141-149.
"Reduction of Titanium Silicide Degradation During Borophosphosilicate Glass Reflow", by R. Burmaster et al., Conf. Proc. ESDERC 89, Springer-Verlag, 1989, pp. 233-236.
"Doping of N+ and P+ Polysilicon in a Dual-Gate CMOS Process", by C. Y. Wong, et al., IBM Research Division, T. J. Watson Research Center, 1988, pp. 238-241.
"0.5 Micron CMOS for High Performance at 3.3 V", by R. A. Chapman, Techn. Dig. IEDM 88, 1988, pp. 52-55.
"Dopant Redistribution in Dual Gate W Polycide CMOS and Its Improvement by RTA", by H. Hayashida et al., Conf. Proc. VLSI Symp., 1989, pp. 29-30.
"A High Performance 0.25 μm CMOS Technology", by B. Davari, et al., Techn. Dig. IEDM, 1988, pp. 56-59.
"Boron Diffusion Within TaSi2/Poly-Si Gates", by U. Schwalke, et al., Journal of Vacuum Science & Technology, No. 1, New York, Jan./Feb. 1989, pp. 120-126.

*Primary Examiner*—T. N. Quach
*Attorney, Agent, or Firm*—Hill, Steadman & Simpson

[57] ABSTRACT

Method for producing a doped polycide layer on a semiconductor substrate. A polycide layer (14) is formed by producing a metal silicide layer (13a) on a polysilicon layer (12a). After the formation thereof, the polycide layer (14) is doped to an ulltimate value of the dopant concentration by an implantation. The polysilicon layer can be pre-doped. The method is particularly suited for the manufacture of p+-doped polycide gates in a salicide process.

20 Claims, 4 Drawing Sheets

METHOD FOR PRODUCING A DOPED POLYCIDE LAYER ON A SEMICONDUCTOR SUBSTRATE

BACKGROUND OF THE INVENTION

Doped polycide layers, i.e. composite layers of a doped silicon layer that is polycrystalline or amorphous and a metal silicide layer arranged thereon, are becoming more significant in LSI semiconductor circuits. For example, doped polycide layers are used in bipolar technology as terminal structures for emitters, bases and collectors and are used in CMOS technology as gate electrodes.

In the prior art, doped polycide layers are produced, among other things, applying a metal layer onto a doped silicon layer that is polycrystalline o amorphous that is arranged on a semiconductor substrate. With a temperature treatment, a part of the silicon layer reacts with the metal layer to form metal silicide. As a result, a dopant depletion of the remaining part of the silicon layer occurs. A reflow of dopant occurs from the silicon into the metal silicide. This effect is especially pronounced when boron is used as the dopant. The dopant depletion is explained on the basis of a parasitic metal-dopant reaction that occurs during the silicide formation and that leads to the formation of stable metal-dopant compounds such as, for example, $TiB_2$.

The dopant depletion has extremely negative effects in what is referred to as the salicide process that is becoming more significant in CMOS technology. The simultaneous silication of a gate electrode and source/-drain regions in the manufacture of MOS transistors is referred to as a salicide process. In this process, a metal, for example titanium, is deposited surface-wide on transistor regions that are already structured. Given a suitable temperature treatment, the silicide formation occurs on the exposed silicon surfaces, i.e. on the surface of a gate electrode of polysilicon or of amorphous silicon and o the substrate surface in the source/drain regions, the unreacted metal being preserved on regions masked with silicon oxide or silicon nitride. The metal and potential reaction products are selectively removed vis-a-vis the metal silicide by employing an appropriate etchant, so that the metal silicide remains only on the gate electrode and on the source/drain regions. A reduction in sheet and contact resistivities is achieved with this method and improves the transistor performance. The salicide process is described, for example, in an article by M. E. Alperin et al., IEEE Trans. Electron Devices, ED-32, 141 (1985).

The dopant depletion occurs both in the silicon electrode as well as in the source/drain regions in the salicide process. It therefore leads to increase source/drain contact resistances (see the article by A. Mitwalsky et al., 6th International Symposium on Silicon Materials Science and Technology, ECS. Montreal, May 1990) and leads to the formation of a space-charge zone in the gate electrode. These effects reduce the saturation drain current which in turn leads to a loss of performance.

Since the dopant depletion is especially pronounced in the presence of boron, this effect particularly occurs for boron-doped or $BF_2$-doped gate electrodes and source/drain regions (see the articles by C. Y. Wong et al., Techn. Dig. IEDM 88, pages 238–241 (1988) and R. A. Chapman et al., Techn. Dig. IEDM 88, pages 52–55 (1988)). Gate electrodes of p+-doped polycide and p-channel transistors are therefore particularly affected by the dopant depletion in the salicide process.

It is known from the literature in the prior art to suppress the dopant depletion by, for example, limiting the temperature parameters (see the article by H. Hayashida et al., Conf. Proc. VLSI Symp., pages 29–30 (1989)) or by reducing the silicide thickness (see the article by B. Davari et al., Techn. Dig. IEDM 88, pages 56–59 (1988)).

A reduction in the silicide thickness, however, has the disadvantage that it deteriorates both the conductivity in the gate electrode as well as the temperature stability of the silicide (see the article by R. Burmaster et al., Conf. Proc. ESDERC 89, pages 233–36, Springer-Verlag, 1989, edited by Hauberger, Ryssel, Lange).

The reduction in the temperature parameters leads to a significant limitation of the process management. This is especially disadvantageous since only slight improvements can be achieved by means of this measure.

The introduction of an intermediate layer acting as a diffusion barrier between the silicon layer and the metal silicide layer is possible for suppressing the dopant depletion. This, however, has the disadvantage of a noticeable increase in the complexity of the process and is limited to the gate electrode in the salicide process.

SUMMARY OF THE INVENTION

It is an object of the present invention to provide a method for manufacturing a doped polycide layer wherein the dopant depletion is avoided and that is compatible with the salicide process.

This object is inventively achieved by a method having the following steps: producing a silicon layer that is not single-crystal on the semiconductor substrate; providing the silicon layer with a pre-doping producing a metal silicide layer on the silicon layer so as to form the polycide layer composed of silicon and metal silicide and after the formation thereof, doping the polycide layer to a final value of dopant concentration with implantation.

The critical part of the dopant depletion in the known method occur during the silication reaction. The dopant depletion is therefore avoided in the method of the present invention in that the ultimate dopant distribution in the polycide layer is determined by the implantation after the silication reaction. This has the advantage that the silication reaction is implemented without limitations.

Th silicon layer is provided with a pre-doping before producing the metal silicide layer. This measure is particularly advantageous for boron doping, since the maximally obtainable doping in the silicon is limited any way due to the relatively low solubility of boron in silicon.

A division of the boron implantation is thereby enabled in the manufacture of p+-doped polycide gates. This has the advantage that the temperature stress is distributed and, thus, the risk of boron penetration is reduced for p+-doped polycide gates.

It is within the scope of the present invention to deposit the silicon layer in polycrystalline or amorphous fashion.

The known methods of co-sputtering of metal and silicon, chemical vapor deposition (CVD) of the metal silicide and of the metal on the silicon layer with a following thermal treatment are suitable for producing the metal silicide layer. It is especially advantageous to produce the metal silicide layer by deposition of a metal layer on the silicon layer with a subsequent thermal treatment. This reaction occurs selectively between metal and silicon, so that regions that are not to be silicated on the surface of the silicon layer can be masked with, for example, $SiO_2$ or $Si_3N_4$.

It is within the scope of the present invention to apply the method in a salicide process for producing a MOS transistor. Source and drain regions or the MOS transistor are produced in the implantation following the silication reaction. As discussed above, both the gate electrode as well as the surface of the source/drain regions are silicated in the silication reaction in the salicide process. Since the implantation of the source/drain regions in the present invention does not occur until after the silication reaction, a dopant depletion of the source/drain regions is also avoided.

It is within the scope of the present invention to employ the manufacturing method in an overall salicide-CMOS process for producing n-channel and p-channel transistors having p+-doped polycide gates. In this case, the n-channel transistor is executed as a buried channel device and the p-channel transistor is executed as a surface channel in MOSFET. This leads to a significant increase in the useful transistor life and can therefore be advantageously utilized for a five-volt application.

A further embodiment of the present invention is use in an overall salicide-CMOS process for manufacturing n-channel transistors having n+-doped polycide gates and p-channel transistors having p+-doped polycide gates (what are referred to as dual work function gates). In this case, both the n-channel transistors as well as the p-channel transistors are manufactured as surface-channel MOSFETs. These have an excellent short channel behavior. This embodiment is therefore advantageous for manufacturing CMOS circuits having transistors with short gate length that can be operated at reduced supply voltage.

In further developments of the present invention the silicon layer is produced as a polysilicon layer. The metal silicide layer contains a silicide of at least one of the metals titanium, tantalum, tungsten, molybdenum, cobalt, nickel and platinum.

The method of the present invention has the following further steps a metal layer is deposited onto the silicon layer; and a part of the silicon layer is converted into the metal silicide layer by reaction with the metal layer arranged thereon using a thermal treatment. The method also has the following steps: a substrate of silicon, at whose surface masking structures are arranged of a material that does not react with the metal layer to form metal silicide during the thermal treatment, is used as the semiconductor substrate; the silicon layer is structured before the deposition of the metal layer; and the metal layer is deposited surface-wide onto the surface of the silicon layer, the surface of the masking structures and the surface of the exposed regions of the substrate, so that metal silicide forms at the surface of the silicon layer and the surface of the exposed regions of the substrate during the temperature treatment, whereas the unreacted metal is preserved on the masking structures.

The method further comprises the following steps: an insulating layer is produced between the substrate and the silicon layer at least in one region of the silicon layer, the insulating layer being structured such that it has common side walls with the silicon layer in this region; and side wall coverings of an insulating material that does not react with the metal layer to form metal silicide during the thermal treatment are produced at the side walls before the deposition of the metal layer.

The masking structures and the side wall coverings can contain at least one of the materials silicon oxide and silicon nitride. At least a part of the structured silicon layer arranged on the insulating layer can form a gate electrode and the insulating layer arranged therebelow can form a gate dielectric for a MOS transistor. Source and drain regions for the MOS transistor are formed in the substrate during the implantation for doping the polycide layer.

The method further has the following steps: a first well having a first conductivity type and a second well having a second conductivity type opposite that of the first conductivity type are produced in the substrate; a first region in the first well for the acceptance of a first MOS transistor and a second region in the second well for the acceptance of a second MOS transistor complementary vis-a-vis the first MOS transistor are defined by field oxide regions; after producing a gate oxide layer at the surface of the first region and the surface of the second region, a doped polysilicon layer of the first conductivity type is produced surface-wide and a cover layer is produced thereon, the cover layer containing at least one of the materials, silicon oxide and silicon nitride; a first photoresist mask that leaves only the first region uncovered is produced after formation of a first gate electrode for the first MOS transistor and a second gate electrode for the second MOS transistor by structuring the polysilicon layer and after the formation of side wall coverings at the side walls of the first gate electrode and of the second gate electrode; the first photoresist mask is removed after the formation of first source and drain regions for the first MOS transistor by implantation of doping ions of the second conductivity type upon employment of the first gate electrode and the first photoresist mask as an implantation mask; after the removal of the cover layer, the metal layer is applied surface-wide and the thermal treatment for forming metal silicide is implemented; using a second photoresist mask as an implantation mask that leaves only the second region uncovered, an implantation with doping ions of the first conductivity type is implemented for setting an ultimate value of the dopant concentration in the second gate electrode and for the formation of second source/drain regions for the second MOS transistor; and an intermediate oxide layer is produced surface-wide after the removal of the second photoresist mask.

Alternatively, the method can have the following steps: a first well of a first conductivity type and a second well of a second conductivity type opposite the first conductivity type are produced in the substrate; a first region in the first well for the acceptance of a first MOS transistor and a second region in the second well for the acceptance of a second MOS transistor complementary vis-a-vis the first MOS transistor are defined by field oxide regions; after producing a gate oxide region at the surface of the first region and the surface of the second region, a polysilicon layer is produced surface-wide that, upon employment of a first photoresist mask as an implantation mask, that leaves only the second region uncovered, is doped by implantation in the second region having the first conductivity type; a second photoresist mask that leaves only the first region uncovered is produced after removal of the first photoresist mask and formation of a first gate electrode for the first MOS transistor and of a second gate electrode for the second MOS transistor by structuring the polysilicon layer and after formation of side wall coverings at the side walls of the first gate electrode and of the second gate electrode; the second photoresist mask is removed after the formation of first source and drain regions for the first MOS transistor and doping of the first gate electrode by implantation of doping ions of the second conductivity type upon employment of the second photoresist mask as an implantation mask; the thermal treatment for forming metal silicide is implemented after the surface-wide application of the metal layer; upon employment of a third photoresist mask as implantation mask that leaves only the second region uncovered, an implantation of doping ions of the first conductivity type is implemented for setting an ultimate value of the dopant concentration of the second gate electrode and for the formation of second source and drain regions for the second MOS transistor; and an intermediate oxide layer is produced surface-wide after the removal of the third photoresist mask.

The implantation of the first source and drain regions can occur in two steps with a LDD profile. Preceding the production of the side wall coverings, a LDD implantation of the second source and drain regions can be produced by implantation with doping ions of the first conductivity type using a further photoresist mask as an implantation mask that leaves only the second region uncovered. Doped regions of the first conductivity type are doped with one of the dopants boron and $BF_2$.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

In the method of the present invention a polysilicon layer 12 is applied onto a substrate 11 (see FIG. of, for example, monocrystalline silicon. A metal layer 13 that, for example, is composed of titanium, tantalum, tungsten, molybdenum, cobalt, nickel or platinum is applied onto the polysilicon layer 12. The polysilicon layer 12 has a thickness of, for example, 100 through 500 nm. The metal layer 13 is deposited in a thickness of, for example, 60 nm.

Figure 1:
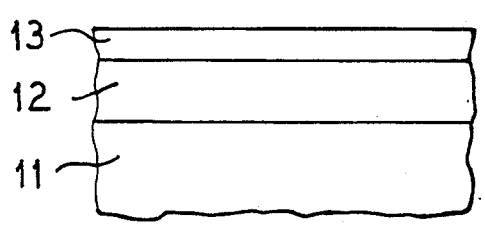
FIG. 1 through FIG. 3 show a process sequence for manufacturing a doped polycide layer.
Figure 2:
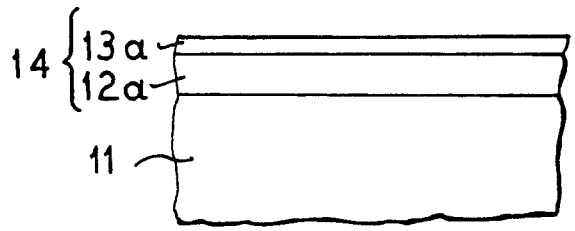

A metal silicide layer 13a (FIG. 2) is formed by reaction between the metal of the metal layer 13 and a part of the polysilicon layer 12 at a temperature between, for example, 600° and 1000° C. The remaining part of the polysilicon layer 12a forms a polycide layer 14 with the metal silicide layer 13a.

It is within the scope of the present invention to produce the metal silicide layer 13a by simultaneous sputtering of the metal and of the silicon with a following temperature treatment for silicide formation or on the basis of chemical vapor deposition.

Figure 3:
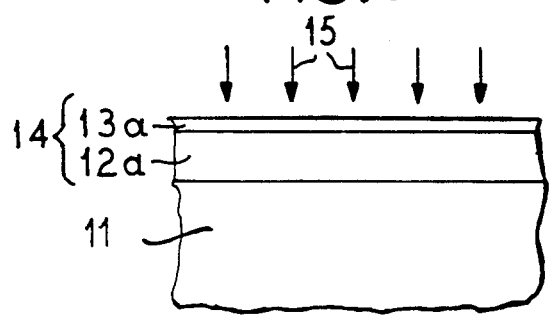

The doping of the polycide layer 14 by implantation, indicated by reference numeral 15 in FIG. 3, occurs after the formation of the polycide layer 14. When the metal silicide layer 13a is composed of a metal silicide in which a strong metal-to-dopant reaction is to be anticipated in high-temperature processes, as is the case, for example, for $TiSi_2$ with the dopant boron, the implantation 15 must occur with such an energy that dopant ions proceed at least up to the boundary surface of the polysilicon layer 12a and the metal silicide layer 13a. In this case, namely, a drive-out of dopant from the metal silicide layer 13a is impossible because of the pronounced, competing metal-to-dopant reaction.

It is within the scope of the present invention to provide the polysilicon layer 12 with a pre-doping before the deposition of the metal layer 13 or, respectively, to provide the polysilicon layer 12a with a pre-doping before producing the metal silicide layer 13a. Although a dopant depletion of the polysilicon layer 12a then occurs during the silication reaction, this is compensated for by the following implantation 15. The ultimate dopant profile is determined by the implantation 15 after the formation of the polycide layer 14.

Figure 4:
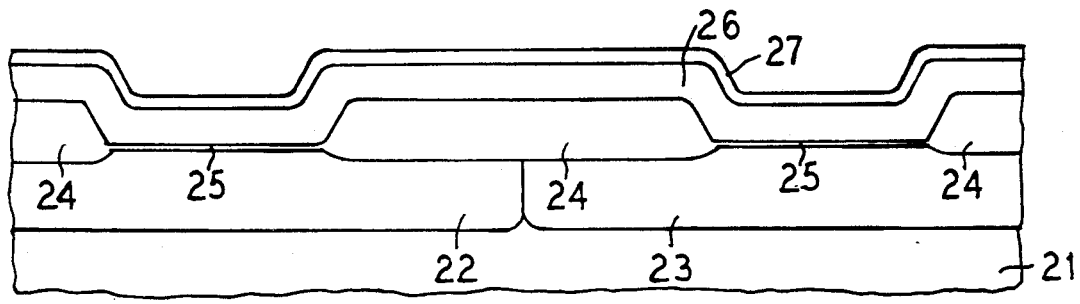
FIG. 4 through FIG. 10 show a $p^+$-gate salicide-CMOS overall process.

A first well 22 that is p-doped and a second well 23 that is n-doped are produced in a substrate 21 (see FIG. 4) of, for example, monocrystalline silicon. The first well 22, for example, is doped with boron and has a dopant concentration of, for example, $5 \times 10^{16}$ cm$^{-3}$. The second well 23, for example, is doped with phosphorus and has a dopant concentration of $5 \times 10^{16}$ cm$^{-3}$. A first region for the acceptance of a first MOS transistor in the first well 22 and a second region for the acceptance of a second MOS transistor that is complementary relative to the first MOS transistor and the second well 23 are defined by the field oxide regions 24. The field oxide regions serve the purpose of separating the active transistors. The field oxide regions 24, the first well 22 and the second well 23 are produced, for example, with a LOCOS technique. The first MOS transistor is produced as an NMOS transistor and the second MOS transistor is produced as a PMOS transistor. A gate oxide layer 25 is produced in a known way at the surface of the first well 22 and of the second well 23.

A polysilicon layer 26 is deposited surface-wide. The polysilicon layer 26 is deposited to a thickness of, for example, 100 through 500 nm and is p-doped by implantation of, for example, boron. The implantation thereby occurs with an energy of 15 keV and with a dose of $5 \times 10^{15}$ cm$^{-2}$.

A cover layer 27 of, for example, silicon nitride or silicon oxide is deposited onto the polysilicon layer 26. The cover layer 27 is deposited to a thickness of, for example, 150 nm. The cover layer 27 and the polysilicon layer 26 are structured using a phototechnique (not shown) such that a first gate electrode 26a for the first MOS transistor and a second gate electrode 26b for the second MOS transistor are formed from the polysilicon layer 26.

Figure 5:
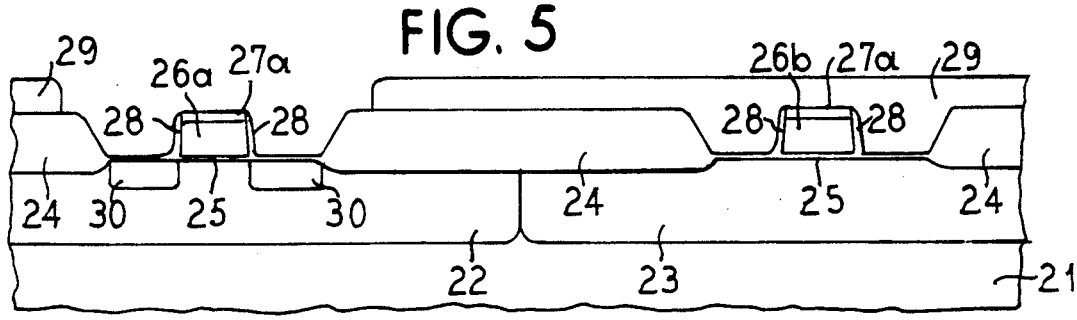

The side walls of the first gate electrode 26a and of the second gate electrode 26b are covered with thin side wall oxides 28 in a re-oxidation step. The production of a first photoresist mask 29 that leaves only the first region uncovered (see FIG. 5) follows.

Figure 6:
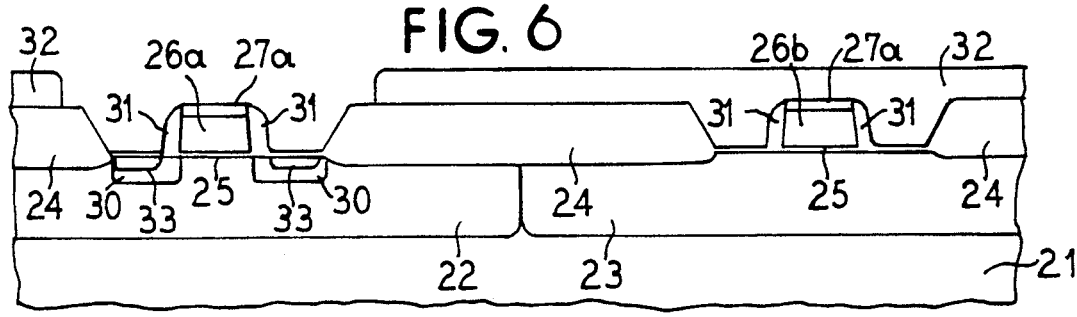

The LDD source/drain regions 30 for the first MOS transistor are produced by an implantation with n-doping ions, for example with phosphorus. The first photoresist mask 29 and the first gate electrode 26a thereby serve as an implantation mask. The implantation of phosphorus ions into the first gate electrode 26a is prevented by the cover layer 27a and by the side wall oxides 28. After the removal of the first photoresist mask 29 (not shown), side wall coverings 31 of, for example, silicon oxide are produced at the side walls of the first gate electrode 26a and of the second gate electrode 26b. After a further photoresist mask 32 is produced, which again leaves only the first region uncovered, highly doped source/drain regions 33 for the first MOS transistor are produced by implantation with arsenic. Since the side wall coverings 31 are broader than the side wall oxides 28, the expanse of the highly doped source/drain regions 33 is less than that of the LDD source/drain regions 30 (see FIG. 6).

The structured cover layer 27a is removed after the removal of the further photoresist masks. The source/drain regions 30, 33 can be activated by applying a tempering after the removal of the further resist mask 32, which has a beneficial influence on the following silication.

Figure 7:
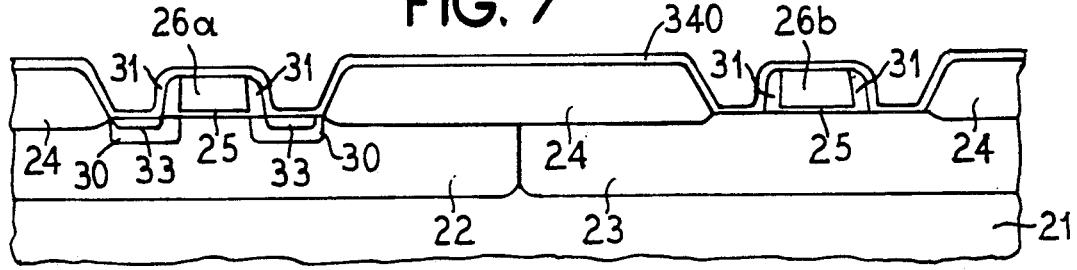
Figure 8:
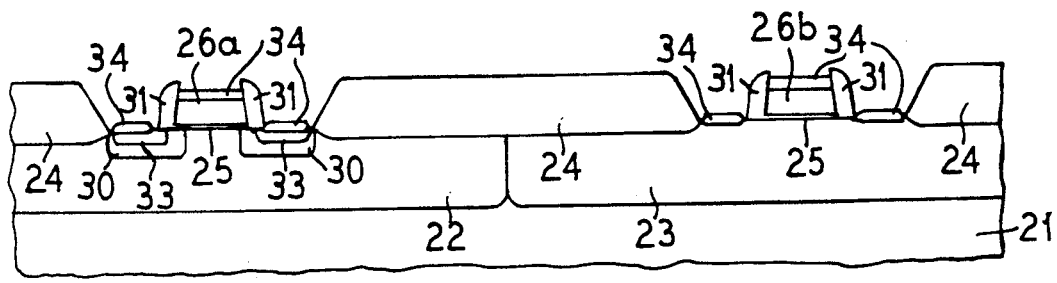

Metal silicide 34 is produced at the surface of the first gate electrode 26a and the surface of the second gate electrode 26b and at the surface of the first well 22 and the surface of the second well 23 by applying a metal layer 340 of, for example, titanium (see FIG. 7) and by subsequent treatment at, for example, 600° through 1000° C. (see FIG. 8). A dopant depletion thereby occurs in the first gate electrode 26a and in the second gate electrode 26b.

Figure 9:
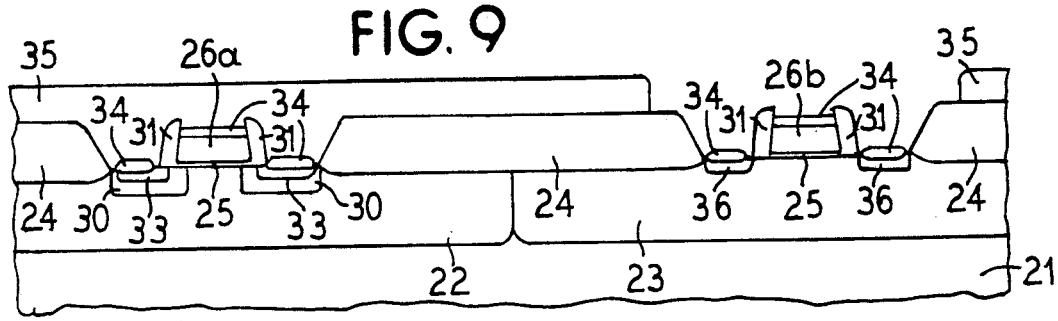

The dopant depletion in the second gate electrode 26b is compensated by implantation with, for boron upon employment of a second photoresist mask 35 as an implantation mask that leaves only the second region uncovered. Simultaneously, source/drain regions 36 for the second MOS transistor are implanted (see FIG. 9). The boron implantation occurs, for example, with an energy of 30 keV and with a dose of $5 \times 10^{15}$ cm$^{-2}$. The boron implantation, first, must be deep enough in order to reach the boundary surface between metal silicide and polysilicon in the second gate electrode 26b. On the other hand, the boron implantation cannot be excessively deep, so that the source/drain regions 36 meet the requirements of a short channel transistor.

The first gate electrode 26a is shielded from the implantation with boron by the second photoresist mask 35. The dopant depletion is not critical in the first gate electrode 26a since no space charge zone forms in the gate electrode 26a in the first MOS transistor, which is an NMOS-FET, by contrast to the second MOS transistor, which is a PMOS-FET.

Figure 10:
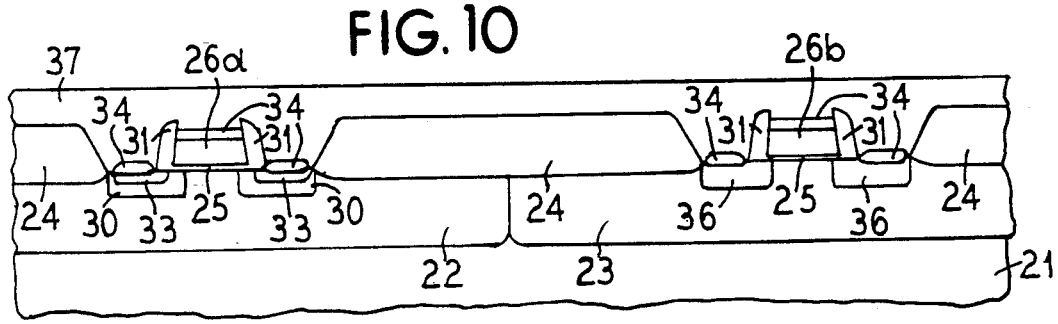

After the removal of the second photoresist mask 35 an intermediate oxide layer 37 (see FIG. 10) is applied surface-wide. A flow tempering occurs for activating the re-implanted dopant. The flow tempering occurs, for example, at 900° C.

Figure 11:
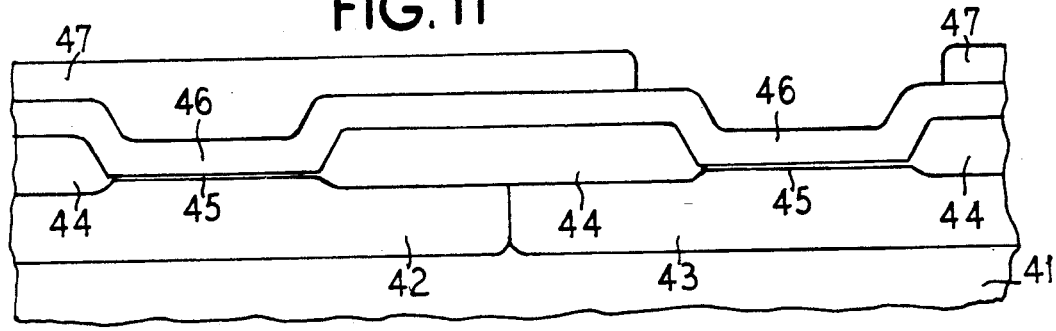

A first well 42 that, for example, is p-doped and a second well 43 that, for example, is n-doped are produced in a substrate 41 of, for example, monocrystalline silicon. The first well, for example, is doped with boron in a concentration of $5 \times 10^{16}$ cm$^{-3}$. The second well 43, for example, is doped with phosphorus in a dopant concentration of $5 \times 10^{16}$ cm$^{-3}$. The field oxide regions 44 are provided for separating active transistor regions. The field oxide regions 44 and the first well 42 and the second well 43 are produced, for example, in LOCOS technology (see FIG. 11).

The first well 42 has a first region that is not covered by the field oxide regions 44 and that is intended for the acceptance of a first MOS transistor. The second well 43 has a second region that is not covered by the field oxide regions 44 and that is intended for the acceptance of a second MOS transistor. Channel implantations (not shown) for the first MOS transistor, which is an NMOS-FET, are provided at the surface of the first region. Channel implantations for the second MOS transistor, which is a PMOS-FET, are provided at the surface of the second region. The exposed surface of the first well 42 and of the second well 43 is provided with a gate oxide layer 45 in a known way.

An undoped polysilicon layer 46 is deposited surface-wide with a thickness of, for example, 100 through 500 nm. After producing a first photoresist mask 47 that leaves only the second region uncovered, boron is implemented with an energy of, for example, 15 keV and with a dose of, for example, $5 \times 10^{15}$ cm$^{-3}$ for the p-doping of the polysilicon layer 46.

Figure 12:
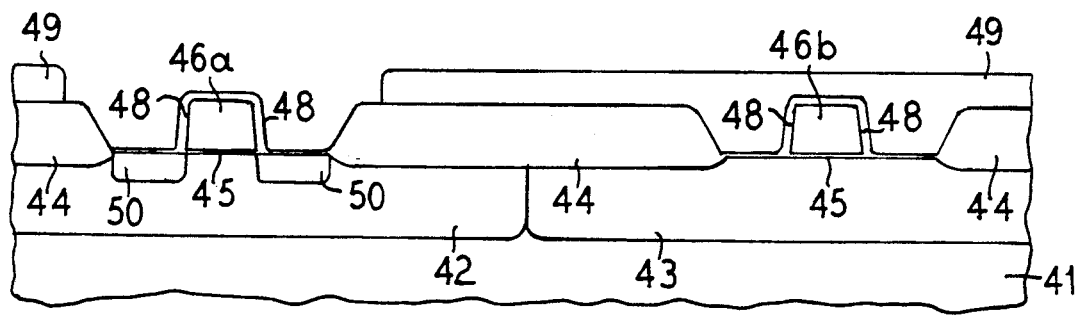

After the removal of the first photoresist mask 47 and the implementation of a phototechnique (not shown), a first gate electrode 46a and a second gate electrode 46b are produced by structuring the polysilicon layer 46. The first gate electrode 46a is arranged in the region of the first MOS transistor and, in accordance with the manufacture, is composed of undoped polysilicon (see FIG. 12). The second gate electrode 46b lies in the region of the second MOS transistor and, in accordance with the manufacture, is composed of p+-doped polysilicon.

Thin side wall oxides 48 are produced at the side walls of the first gate electrode 46a and of the second gate electrode 46b using a re-oxidation. An implantation with phosphorus for forming LDD source/drain regions 50 for the first MOS transistor occurs after the formation of a second photoresist mask 49 that leaves only the first region uncovered (see FIG. 12). The implantation occurs, for example, with the following parameters: energy of 60 keV; dose of $3 \times 10^{13}$ cm$^{-2}$.

After the removal of the second photoresist mask 49 (not shown), side wall coverings 51 of, for example, silicon oxide or silicon nitride are produced at the side walls of the first gate electrode 46a and of the second gate electrode 46b.

Figure 13:
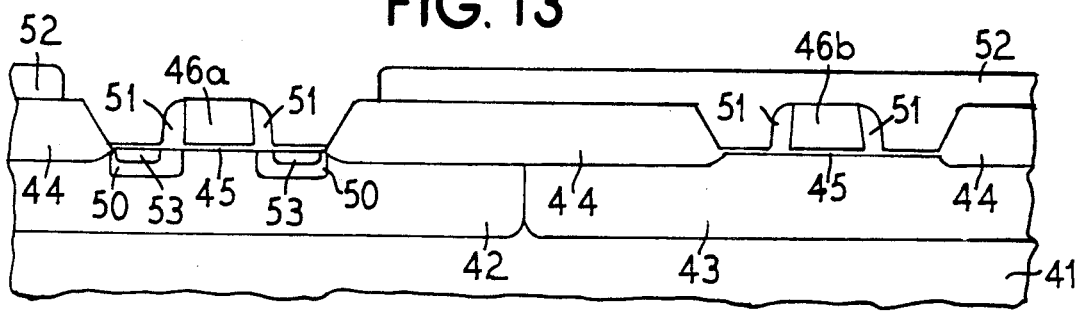

After the formation of a further photoresist mask 52 that again leaves only the first region uncovered, highly doped source/drain regions 53 for the first MOS transistor are produced by an arsenic implantation. The first gate electrode 46a is n+-doped in the arsenic implantation (see FIG. 13). Since the expanse of the side wall coverings 51 is greater than that of the side wall oxides 48, the highly doped source/drain regions 53 have a different expanse than the LDD source/drain regions 50. The arsenic implantation occurs, for example, with the following parameters: energy of 50 keV; dose of $5 \times 10^{15}$ cm$^{-2}$.

The removal of the further photoresist mask 52 follows. It is within the scope of the present invention to subsequently activate the source/drain regions of the first MOS transistor with a tempering. The subsequent silication is thereby improved.

Figure 14:
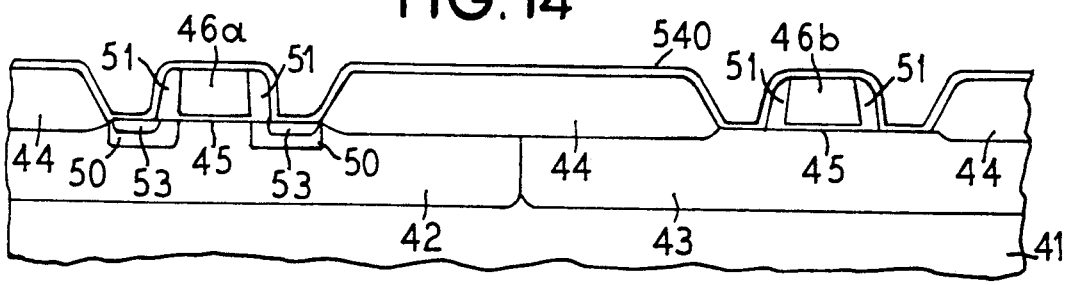
Figure 15:
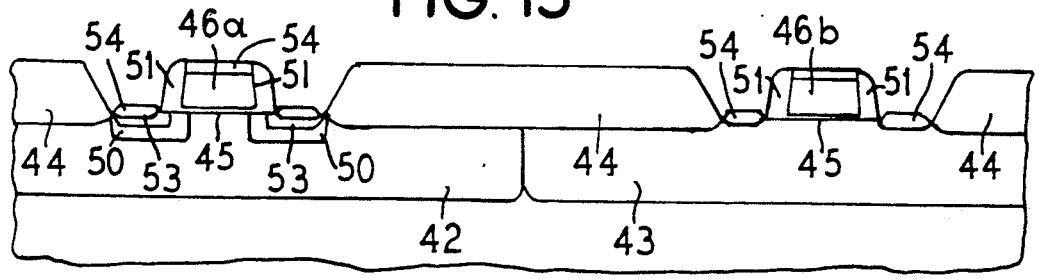

A metal layer 540 of, for example, titanium is subsequently applied surface-wide (see FIG. 14). Metal silicide 54, for example TiSi$_2$, is selectively produced (see FIG. 15) at the exposed silicon surfaces of the first well 42 and of the second well 43 as well as at the surface of the first gate electrode 46a and of the second gate electrode 46b that are composed of polysilicon, being selectively produced by a thermal treatment at, for example, 600° through 1000° C. A dopant depletion as a consequence of the metal-to-dopant reaction between titanium and boron occurs in the second gate electrode 46b during the silication reaction. Such a metal-to-dopant reaction does not occur to a considerable extent between arsenic and titanium in the first gate electrode 46a, so that here it can be considered not to be a dopant depletion.

After producing a third photoresist mask 55 that leaves only the second region uncovered, a boron implantation occurs for compensating the dopant depletion in the second gate electrode 46b. Simultaneously, source/drain regions 56 for the second MOS transistor are produced during the implantation with boron. The boron implantation occurs, for example, with the following parameters: energy of 30 keV; dose of $5 \times 10^{15}$ cm$^{-2}$.

Figure 16:
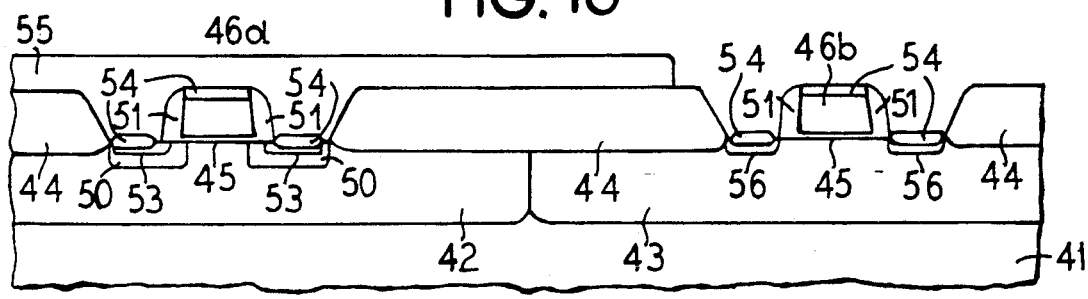
FIG. 11 through FIG. 17 show a $n^+/p^+$-gate salicide-MOS overall process.

Care must be exercised during the implantation with boron to ensure that the dopant proceeds at least up to the boundary surface between the metal silicide 54 and the polysilicon in the second electrode 46b. Due to the strong metal-to-dopant reaction, namely, a later drive-out of boron from the metal silicide 54 into the polysilicon is not possible. On the other hand, the boron implantation must be managed such that the source/drain regions 56 meet the requirements of the second MOS transistor (see FIG. 16)

Figure 17:
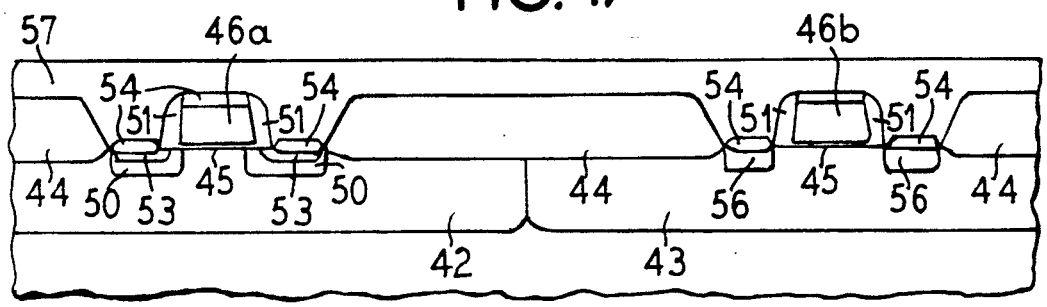

An intermediate oxide layer 57 (see FIG. 17) is produced surface-wide after the removal of the third photoresist mask 55 and the structure is subjected to a flow tempering at, for example, 900° C. The source/drain regions 56 of the second MOS transistor are activated during the flow tempering. If it has not already occurred, the highly doped source/drain regions 53 and the LDD source/drain regions 50 of the first MOS transistor are also activated during this step.

The manufacturing process is ended in a known way by etching via holes and by metallizations.

The invention is not limited to the particular details of the apparatus depicted and other modifications and applications ar contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for producing a doped polycide layer on a semiconductor substrate, comprising the steps of:
   producing a silicon layer that is not single-crystal on the semiconductor substrate;
   producing the silicon layer with a pre-doping;
   producing a metal silicide layer on the silicon layer so as to form the polycide layer composed of silicon and metal silicide; and
   after the formation thereof, doping the polycide layer to an ultimate value of dopant concentration using an implantation;
wherein the step of producing a metal silicide layer comprises the steps of:
   depositing a metal layer onto the silicon layer; and
   converting a part of the silicon layer into the metal silicide layer by reaction with the metal layer arranged thereon using a thermal treatment;
wherein the method further comprises the steps of:
   using a substrate of silicon as the semiconductor substrate at whose surface are arranged masking structures of a material that does not react with the metal layer to form metal silicide during the thermal treatment;
   structuring the silicon layer before the deposition of the metal layer; and
   depositing the metal layer surface-wide onto a surface of the silicon layer, a surface of the masking structures and a surface of the exposed regions of the substrate, so that metal silicide forms at the surface of the silicon layer and the surface of the exposed regions of the substrate during the thermal treatment, whereas unreacted metal is preserved on the masking structures;
wherein the method further has the steps of:
   producing an insulating layer between the substrate and the silicon layer at least in one region of the silicon layer, said insulating layer being structured such that the insulating layer has common side walls with the silicon layer in this region; and
   producing side wall coverings of an insulating material, that does not react with the metal layer to form metal silicide during the thermal treatment, at the side walls before the deposition of the metal layer;
wherein at least a part of the structured silicon layer arranged on the insulating layer forms a gate electrode and the insulating layer arranged therebelow forms a gate dielectric for a MOS transistor and wherein source and drain regions for the MOS transistor are formed in the substrate during the implantation for doping the polycide layer; and wherein the method further comprises the steps of:
   a) producing in the substrate a first well having a first conductivity type and a second well having a second conductivity type opposite that of the first conductivity type;
   b) defining a first region in the first well for the acceptance of a first MOS transistor and a second region in the second well for the acceptance of a second MOS transistor complementary vis-a-vis said first MOS transistor by field oxide regions;
   c) first producing a gate oxide layer at a surface of the first region and a surface of the second region, then producing a doped polysilicon layer of the first conductivity type surface-wide and producing a cover layer thereon, said cover layer containing at least one of silicon oxide and silicon nitride;
   d) producing a first photoresist mask that leaves only the first region uncovered after formation of a first gate electrode for the first MOS transistor and of a second gate electrode for the second MOS transistor by structuring the polysilicon layer and after formation of side wall coverings at side walls of the first gate electrode and of the second gate electrode;
   e) removing the first photoresist mask after the formation of first source region and first drain region for the first MOS transistor by implantation of doping ions of the second conductivity type upon employment of the first gate electrode and of the first photoresist mask as an implantation mask;
   f) after removing of the cover layer, applying the metal layer surface-wide and implementing the thermal treatment for forming metal silicide;
   g) using a second photoresist mask as an implementation mask that leaves only the second region uncovered, implementing an implantation with doping ions of the first conductivity type being implemented for setting an ultimate value of dopant concentration in the second gate electrode and for the formation of a second source region and a second drain region for the second MOS transistor; and h) producing an intermediate oxide layer surface-wide after removing of the second photoresist mask.

2. The method according to claim 1, wherein the implantation of the first source region and the first drain region occurs in two steps with a LDD profile.

3. The method according to claim 1, wherein, preceding the production of the side wall coverings, a LDD implantation of the second source region and the second drain region is produced by implantation with doping ions of the first conductivity type using a further photoresist mask that leaves only the second region uncovered as an implantation mask.

4. The method according to claim 1, wherein doped regions of the first conductivity type are doped with one of boron and $BF_2$.

5. The method according to claim 1, wherein the metal silicide layer has a silicide of at least one of titanium, tantalum, tungsten, molybdenum, cobalt, nickel and platinum.

6. A method for producing a doped polycide layer on a semiconductor substrate, comprising the steps of:

producing a silicon layer that is not single-crystal on the semiconductor substrate;

producing the silicon layer with a pre-doping;

producing a metal silicide layer on the silicon layer so as to form the polycide layer composed of silicon and metal silicide; and after the formation thereof, doping the polycide layer to an ultimate value of dopant concentration using an implantation;

wherein the step of producing a metal silicide layer comprises the steps of:

depositing a metal layer onto the silicon layer; and converting a part of the silicon layer into the metal silicide layer by reaction with the metal layer arranged thereon using a thermal treatment;

wherein the method further comprises the steps of:

using a substrate of silicon as the semiconductor substrate at whose surface are arranged masking structures of a material that does not react with the metal layer to form metal silicide during the thermal treatment;

structuring the silicon layer before the deposition of the metal layer; and depositing the metal layer surface-wide onto a surface of the silicon layer, a surface of the masking structures and a surface of the exposed regions of the substrate, so that metal silicide forms at the surface of the silicon layer and the surface of the exposed regions of the substrate during the thermal treatment, whereas unreacted metal is preserved on the masking structures;

wherein the method further has the steps of:

producing an insulating layer between the substrate and the silicon layer at lest in one region of the silicon layer, said insulating layer being structured such that the insulating layer has common side walls with the silicon layer in this region; and producing side wall coverings of an insulating material, that does not react with the metal layer to form metal silicide during the thermal treatment, at the side walls before the deposition of the metal layer;

wherein at lest a part of the structured silicon layer arranged on the insulating layer forms a gate electrode and the insulating layer arranged therebelow forms a gate dielectric for a MOS transistor and whereby source and drain regions for the MOS transistor are formed in the substrate during the implantation for doping the polycide layer; and wherein the method further comprises the steps of:

a) producing a first well of a first conductivity type and a second well of a second conductivity type opposite said first conductivity type in the substrate;

b) defining a first region in the first well for the acceptance of a first MOS transistor and a second region in the second well for the acceptance of a second MOS transistor complementary vis-a-vis said first MOS transistor using field oxide regions;

c) after producing a gate oxide region at a surface of the first region and a surface of the second region, producing a polysilicon layer surface-wide that, upon employment of a first photoresist mask as an implantation mask that leaves only the second region uncovered, is doped by implantation in the second region having the first conductivity type;

d) producing a second photoresist mask that leaves only the first region uncovered after removal of the first photoresist mask and formation of a first gate electrode for the first MOS transistor and of a second gate electrode for the second MOS transistor by structuring the polysilicon layer and after formation of side wall coverings at side walls of the first gate electrode and of the second gate electrode;

e) removing the second photoresist mask after the formation of a first source region and a first drain region for the first MOS transistor and doping of the first gate electrode by implantation of doping ions of the second conductivity type using the second photoresist mask as an implantation mask;

f) implementing the thermal treatment for forming metal silicide after the surface-wide application of the metal layer;

g) using a third photoresist mask as an implantation mask that leaves only the second region uncovered, implementing an implantation of doping ions of the first conductivity type for setting an ultimate value of dopant concentration of the second gate electrode and for formation of a second source region and a second drain region for the second MOS transistor; and h) producing an intermediate oxide layer surface-wide after the removing of the third photoresist mask.

7. The method according to claim 6, wherein the implantation of the first source region and the first drain region occurs in two steps with a LDD profile.

8. The method according to claim 6, wherein, preceding the production of the side wall coverings, a LDD implantation of the second source region and the second drain region is produced by implantation with doping ions of the first conductivity type using a further photoresist mask that leaves only the second region uncovered as an implantation mask.

9. The method according to claim 6, wherein doped regions of the first conductivity type are doped with one of boron and BF$_2$.

10. The method according to claim 6, wherein the metal silicide layer has a silicide of at least one of titanium, tantalum, tungsten, molybdenum, cobalt, nickel and platinum.

11. Method for producing MOS transistors having a polycide layer composed of silicon and metal silicide, comprising the steps of:
   a) providing a substrate of silicon;
   b) producing in the substrate a first well having a first conductivity type and a second well having a second conductivity type opposite that of the first conductivity type;
   c) defining a first region in the first well for the acceptance of a first MOS transistor and a second region in the second well for the acceptance of a second MOS transistor complementary vis-a-vis said first MOS transistor by field oxide regions;
   d) first producing a gate oxide layer at a surface of the first region and a surface of the second region, then producing a doped polysilicon layer of the fist conductivity type surface-wide and producing a cover layer thereon, said cover layer containing at least one of silicon oxide and silicon nitride;
   e) producing a first photoresist mask that leaves only the first region uncovered after formation of a first gate electrode for the first MOS transistor and of a second gate electrode for the second MOS transistor by structuring the polysilicon layer and after formation of side wall coverings at side walls of the first gate electrode and of the second gate electrode;
   f) removing the first photoresist mask after the formation of first source region and first drain region for the first MOS transistor by implantation of doping ions of the second conductivity type upon employment of the first gate electrode and of the first photoresist mask as an implantation mask;
   g) after removing of the cover layer, applying a metal layer surface-wide and implementing a thermal treatment for forming a metal silicide layer so as to form the polycide layer composed of silicon and metal silicide;
   h) using a second photoresist mask as an implementation mask that leaves only the second region uncovered, implementing an implantation with doping ions of the first conductivity type for setting an ultimate value of dopant concentration in the second gate electrode and for the formation of a second source region and a second drain region for the second MOS transistor; and
   i) producing an intermediate oxide layer surface-wide after removing of the second photoresist mask.

12. The method according to claim 11, wherein the implantation of the first source region and the first drain region occurs in two steps with a LDD profile.

13. The method according to claim 11, wherein, preceding the production of the side wall coverings, a LDD implantation of the second source region and the second drain region is produced by implantation with doping ions of the first conductivity using a further photoresist mask that leaves only the second region uncovered as an implantation mask.

14. The method according to claim 11, wherein doped regions of the first conductivity type are doped with one of boron and BF$_2$.

15. The method according to claim 11, wherein the metal silicide layer has a silicide of at least one of titanium, tantalum, tungsten, molybdenum, cobalt, nickel and platinum.

16. Method for producing MOS transistors, comprising the steps of:
   a) providing a substrate of silicon;
   b) producing a first well of a first conductivity type and a second well of a second conductivity type opposite said first conductivity type in the substrate;
   c) defining a first region in the first well for the acceptance of a first MOS transistor and a second region in the second well for the acceptance of a second MOS transistor complementary vis-a-vis said first MOS transistor using field oxide regions;
   d) after producing a gate oxide region at a surface of the first region and a surface of the second region, producing a polysilicon layer surface-wide that, upon employment of a first photoresist mask as an implantation mask that leaves only the second region uncovered, is doped by implantation in the second region having the first conductivity type;
   e) producing a second photoresist mask that leaves only the first region uncovered after removal of the first photoresist mask and formation of a first gate electrode for the first MOS transistor and of a second gate electrode for the second MOS transistor by structuring the polysilicon layer and after formation of side wall coverings at side walls of the first gate electrode and of the second gate electrode;
   f) removing the second photoresist mask after the formation of a first source region and a first drain region for the first MOS transistor and doping of the first gate electrode by implantation of doping ions of the second conductivity type using the second photoresist mask as an implantation mask;
   g) implementing a thermal treatment for forming metal silicide after a surface-wide application of a metal layer;
   h) using a third photoresist mask as an implantation mask that leaves only the second region uncovered, implementing an implantation of doping ions of the first conductivity type for setting an ultimate value of dopant concentration of the second gate electrode and for formation of a second source region and a second drain region for the second MOS transistor; and
   i) producing an intermediate oxide layer surface-wide after the removing of the third photoresist mask.

17. The method according to claim 16, wherein the implantation of the first source region and the first drain region occurs in two steps with a LDD profile.

18. The method according to claim 16, wherein, preceding the production of the side wall coverings, a LDD implantation of the second source region and the second drain region is produced by implantation with doping ions of the first conductivity type using a further photoresist mask that leaves only the second region uncovered as an implantation mask.

19. The method according to claim 16, wherein doped regions of the first conductivity type are doped with one of boron and BF$_2$.

20. The method according to claim 16, wherein the metal silicide layer has a silicide of at lest one of titanium, tantalum, tungsten, molybdenum, cobalt, nickel and platinum.

* * * * *